(12) United States Patent  
Milliron et al.

(10) Patent No.: US 9,151,597 B2  
(45) Date of Patent: Oct. 6, 2015

(54) IN SITU SUBSTRATE DETECTION FOR A PROCESSING SYSTEM USING INFRARED DETECTION

(71) Applicant: FIRST SOLAR, INC., Perrysburg, OH (US)

(72) Inventors: Benjamin Milliron, Toledo, OH (US); Dale Roberts, Temperance, MI (US); David Berger, Holland, OH (US); William Logan, Perrysburg, OH (US)

(73) Assignee: First Solar, Inc., Perryburg, OH (US)

( * ) Notice: Subject to any disclaimer, the term of this patent is extended or adjusted under 35 U.S.C. 154(b) by 313 days.

(21) Appl. No.: 13/763,827

(22) Filed: Feb. 11, 2013

(65) Prior Publication Data

US 2013/0206065 A1  Aug. 15, 2013

Related U.S. Application Data

(60) Provisional application No. 61/598,086, filed on Feb. 13, 2012.

(51) Int. Cl.
| | |
|---|---|
| *G01B 11/14* | (2006.01) |
| *H01L 21/66* | (2006.01) |
| *G01B 11/02* | (2006.01) |
| *H01L 21/67* | (2006.01) |
| *H01L 21/677* | (2006.01) |

(52) U.S. Cl.  
CPC .............. *G01B 11/14* (2013.01); *G01B 11/028* (2013.01); *H01L 21/6776* (2013.01); *H01L 21/67248* (2013.01); *H01L 21/67259* (2013.01); *H01L 22/12* (2013.01)

(58) Field of Classification Search  
CPC ................. G01B 11/028; G01B 11/14; H01L 21/67259; H01L 21/67248; H01L 21/6776  
USPC .................................... 250/453; 356/615, 614  
See application file for complete search history.

(56) References Cited

U.S. PATENT DOCUMENTS

| | | |
|---|---|---|
| 3,711,718 A | 1/1973 | Paul |
| 4,258,259 A | 3/1981 | Obara et al. |
| 5,643,050 A | 7/1997 | Chen |
| 5,716,133 A | 2/1998 | Hosokawa et al. |
| 5,719,466 A | 2/1998 | Tsai |
| 5,948,986 A | 9/1999 | Brown |
| 6,034,369 A | 3/2000 | Oda |
| 6,036,360 A | 3/2000 | Takata et al. |
| 6,107,107 A | 8/2000 | Bruce et al. |
| 6,132,585 A | 10/2000 | Midorikawa et al. |
| 6,674,081 B2 | 1/2004 | Hashimoto et al. |
| 7,320,896 B2 | 1/2008 | Fiorini et al. |
| 2009/0197356 A1 | 8/2009 | Bang et al. |
| 2010/0124610 A1 | 5/2010 | Aikawa et al. |
| 2010/0166947 A1* | 7/2010 | Takeda ............................ 427/58 |
| 2010/0216261 A1* | 8/2010 | Brenninger et al. ............ 438/14 |
| 2010/0230595 A1 | 9/2010 | Uchida et al. |
| 2011/0259418 A1 | 10/2011 | Hollars |

FOREIGN PATENT DOCUMENTS

EP    1 915 598 B1    3/2011

* cited by examiner

*Primary Examiner* — Yara B Green  
(74) *Attorney, Agent, or Firm* — Dickstein Shapiro LLP

(57) ABSTRACT

Infrared detection is used to monitor the temperature within a vapor transport deposition processing chamber. Changes in temperature that occur when a substrate passes an infrared detector are detected and used to precisely locate a position of the substrate within the chamber. Position correction of the substrate can also be implemented.

27 Claims, 3 Drawing Sheets

IN SITU SUBSTRATE DETECTION FOR A PROCESSING SYSTEM USING INFRARED DETECTION

CROSS-REFERENCE TO RELATED APPLICATION

This application claims priority to U.S. Provisional Application No. 61/598,086, filed Feb. 13, 2012, which is hereby fully incorporated by reference.

TECHNICAL FIELD

This disclosure relates to using infrared detection to detect the position of a substrate that is being transported within a substrate processing system such as e.g., a vapor transport deposition system.

BACKGROUND

Photovoltaic devices such as e.g., photovoltaic modules or cells can include semiconductor and other materials deposited over a substrate using various deposition systems and techniques. One example is the deposition of a semiconductor material such as cadmium sulfide (CdS) or cadmium telluride (CdTe) thin fihns over a glass substrate using a processing chamber such as e.g., a vapor transport deposition (VTD) chamber.

During the processing, it is important for a system controller to know the positions of the substrates within the processing chamber to ensure, among other things, that there is proper spacing between the substrates and to know what process the substrates are currently undergoing. Typically, the edge position of each substrate is checked before the substrate is placed into the chamber. This gives the controller an initial point to track the substrate as it progresses through the chamber. Unfortunately, the actual substrate position can be shifted/offset from the controller's calculated substrate position at different times during the process. For example, a position shift can occur as the substrate is entering the processing chamber due to the high speed transfer used to place the substrate into the chamber. Other shifts between the actual and controller calculated positions can occur due to speed changes arising from material build up on the rollers transporting the substrates.

Differences between the controller calculated substrate position and the actual substrate position can adversely impact the processing or lead to mishandling of the substrates. Thus, processing systems will incorporate edge detection mechanisms, portions of which reside within the chamber. Each detection mechanism includes a laser that emits a light beam through a chamber window to a reflector located within the chamber at a point somewhere along the substrate travelling path. The reflector reflects the beam back to a detector. When the substrate passes by, the beam is interrupted, signaling the presence of the substrate. The controller can use this information to try to compensate for the new substrate position.

The above detection mechanism has some shortcomings and relies on several factors to be successful, some of which cannot be controlled. For example, the chamber windows must be clean to allow the light beam to enter the chamber, be reflected back and detected. Keeping the windows clean will require additional maintenance and down time, which is undesirable. Moreover, the laser, reflector and detector must remain properly aligned, which is difficult to achieve due to the processing and vibrations within the chamber. Furthermore, there is the general need to prevent the light beam path from being blocked or disrupted by anything other than the substrate to prevent false detections, which is an onerous task.

Accordingly, there is a need and desire for a better way to detect a position of substrate that is being transported within a substrate processing chamber.

DETAILED DESCRIPTION

Figure 1:
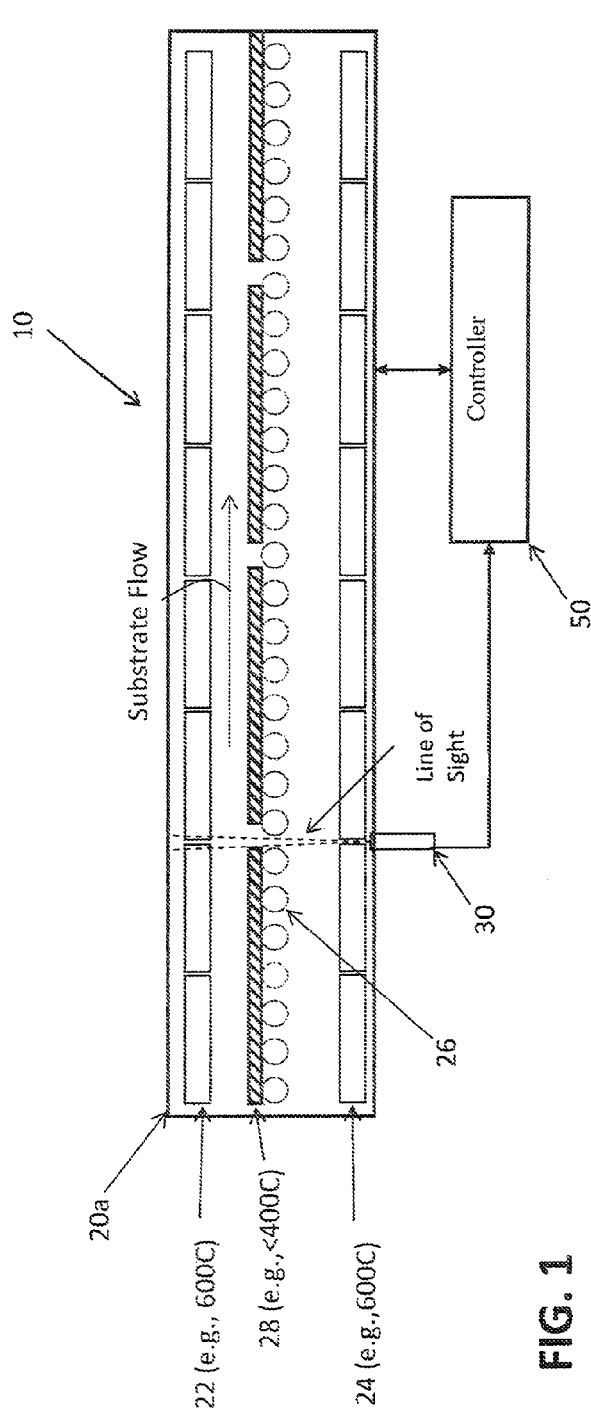
FIG. 1 shows a system for detecting substrate position within a first portion of a processing chamber in accordance with an embodiment of the invention.

FIG. 1 shows a system 10 for detecting substrate position within a first portion 20a of a processing chamber (hereinafter "chamber portion 20a") in accordance with an embodiment of the invention. In the example embodiment, the chamber portion 20a is VTD chamber included within a VTD processing system; it should be appreciated, however, that the system 10 and chamber portion 20a can be any processing system or chamber that utilizes physical vapor deposition, chemical vapor deposition, sputtering or the like. In the illustrated embodiment, the substrate 28 is a glass sheet and the chamber portion 20a is used for one or more processes needed to prepare thin film photovoltaic devices such as e.g., thin film photovoltaic modules or cells. The illustrated chamber portion 20a includes a first set of heaters 22, second set of heaters 24 and rollers 26. It should be appreciated that other pieces of equipment often found in a processing chamber (e.g., the equipment required to deposit materials) are not shown for clarity purposes. In the illustrated embodiment, the substrate 28 is transported through the chamber via the rollers 26 in the direction of the substrate flow arrow.

The chamber portion 20a operates at a sufficient temperature (e.g., 600° C.) that can emit detectable infrared radiation. In accordance with the disclosed principles, the infrared radiation from the chamber portion 20a will be detected from outside the chamber, providing advantages discussed below in more detail. As such, the system 10 also comprises at least one infrared detector 30 externally mounted to the chamber portion 20a. In a desired embodiment, the detector 30 is mounted on a window of the chamber portion 20a with a focusing lens and wave filter pointed into the chamber. The detector 30 will have a "line of sight" into the chamber portion 20a at a point along the substrate flow path. By mounting the infrared detector 30 in this manner, the quantity of infrared radiation from within the chamber portion 20a at the "line of sight" can be detected and reported to a controller 50 as e.g., a varying output voltage. As is discussed below in more detail, the controller 50 will input the output voltage from the detector 30 and use the voltage to determine the location of the substrate 28, one of its edges or gaps between substrates 28. The controller 50 can use the determined location(s) to control, among other things, the rollers 26 to adjust the substrate's 28 position.

It is desirable to place the detector 30 at points where the substrate's 28 temperature will be different from the background temperature (i.e., temperature of the heaters 22, 24) within the chamber portion 20a. In the illustrated embodiment, the background temperature within the chamber portion 20a is much hotter than the temperature of the substrate 28. This condition may arise e.g., when a newly inserted substrate 28 has not undergone any processing within the chamber portion 20a, or has undergone processing at a lower chamber temperature. As is explained below with reference to FIGS. 3 and 4, it is also possible for the background temperature to be cooler than the temperature of the substrate 28. According to the FIG. 1 example, the heaters 22, 24 are e.g., 600° C., causing the background temperature to be at least 600° C., and the substrate temperature is e.g., less than 400° C.

Figure 2:
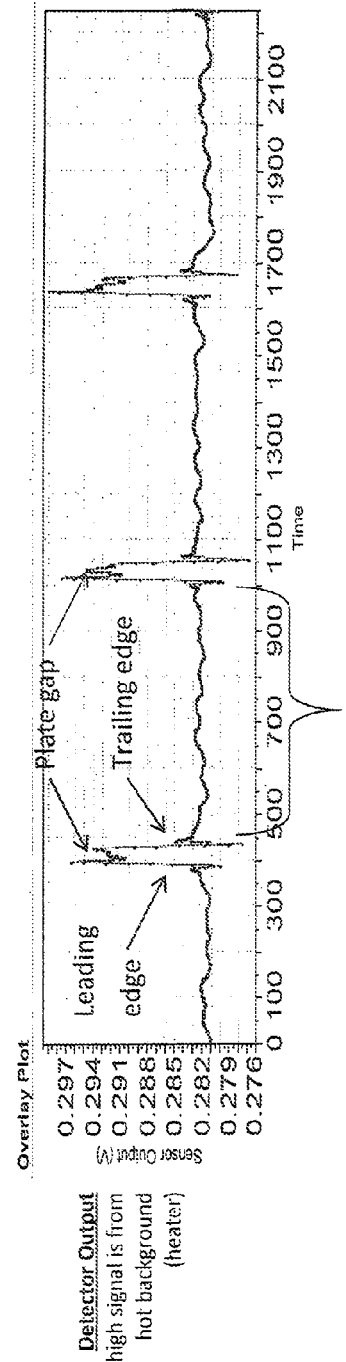
FIG. 2 shows an example detector output from the detector illustrated in FIG. 1.

Referring also to FIG. 2, when gaps between substrates 28 are within the "line of sight" of the infrared detector 30, the detector 30 will output a voltage within a certain voltage range corresponding to the background temperature. When the substrate 28 is within the "line of sight" of the infrared detector 30, the detector 30 will output a voltage within a certain lower voltage range (compared to the background detection) corresponding to the cooler temperature of the substrate 28. The differences between the two voltage ranges can be used to detect trailing and leading edges of substrates 28.

For example, after the entire substrate 28 passes by the detector 30, there will be an abrupt rise in the detector's 30 output voltage due to the detection of the much higher background temperature. This spike in the output voltage, corresponding to the spike in detected temperature, can be used as a signal that a substrate edge was just detected. In FIG. 2, the rightmost portion of a spike indicates that a trailing edge of a substrate 28 has just completely passed the detector 30 while the leftmost portion of the same spike corresponds to a leading edge of a substrate 28 that has just come into the "line of sight" of the detector 30. The exact position of the edges is determined from the location of the detector 30. As can be seen, a gap length between substrates can also be computed from the same information illustrated in FIG. 2.

The disclosed principles can also be used to detect whether the substrate 28 has been improperly rotated or skewed from its intended position within the chamber portion 20a. It is possible for the substrate 28 to rotate or shift from its intended position. Thus, the detection of a gap or edge of the shifted substrate 28 may not represent the "true" gap or orientation of the substrate 28. Accordingly, the chamber portion 20a could include multiple detectors 30 at the same point (separated by a known distance) along the substrate path (see e.g., detectors 130a, 130b in FIG. 5). Having detections from two different detectors, separated by a known distance, the controller 50 will be able to use the output voltages from the detectors to determine if a plate was rotated or skewed. It should be appreciated that the controller 50 may also be able to detect a skewed or rotated substrate using the output voltage from one detector 30. For example, if the controller 50 detects a gradual change in output voltage, instead of the abrupt changes illustrated in FIG. 2, the controller 50 can determine that something is wrong with positioning of the substrate 28.

Figure 3:
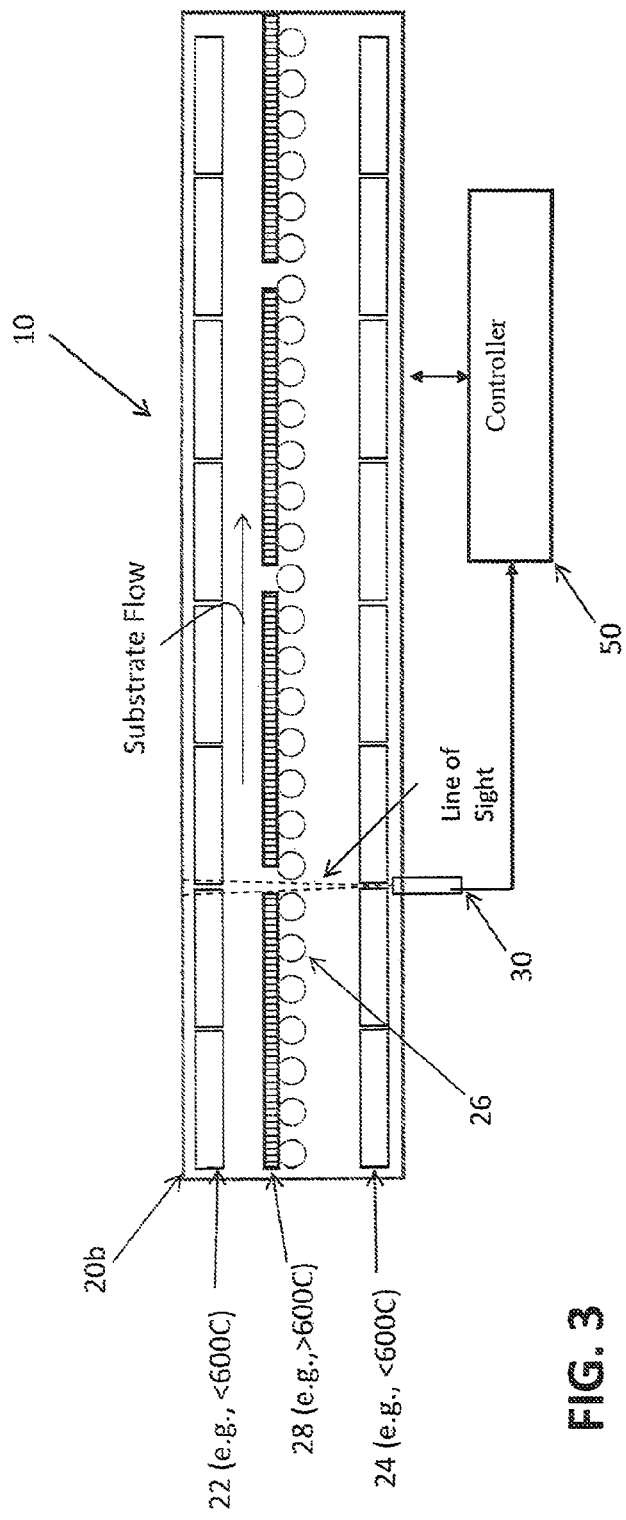
FIG. 3 shows the FIG. 1 system detecting substrate position within a second portion of the processing chamber in accordance with an embodiment of the invention.

FIG. 3 shows the system 10 detecting substrate position within a second portion 20b of the processing chamber (hereinafter "second chamber portion 20b") in accordance with an embodiment of the invention. Similar to FIG. 1, an infrared detector 30 is externally mounted to the second chamber portion 20b. In a desired embodiment, the detector 30 is mounted on a window of the second chamber portion 20b with a focusing lens and wave filter pointed into the chamber. The detector 30 will have a "line of sight" into the second chamber portion 20b at a point along the substrate flow path. As such, the quantity of infrared radiation at the "line of sight" can be detected by the detector 30 and reported to the controller 50 as e.g., a varying output voltage. The controller 50 will input the output voltage from the detector 30 and use the voltage to determine the location of the substrate 28, one of its edges or gaps between substrates 28. The controller 50 can use the determined location(s) to control, among other things, the rollers 26 to adjust the substrate's 28 position.

It is desirable to place the detector 30 at points where the substrate's 28 temperature will be different from the background temperature (i.e., temperature of the heaters 22, 24) within the second chamber portion 20b. In the illustrated embodiment, the background temperature within the second chamber portion 20b is much cooler than the temperature of the substrate 28. This condition may arise after the substrate 28 has undergone some processing and is about to undergo different processing at a lower chamber temperature. According to the FIG. 3 example, the heaters 22, 24 are e.g., less than 600° C., causing the background temperature to be less then 600° C., and the substrate's 28 temperature is e.g., greater than 600° C.

Figure 4:
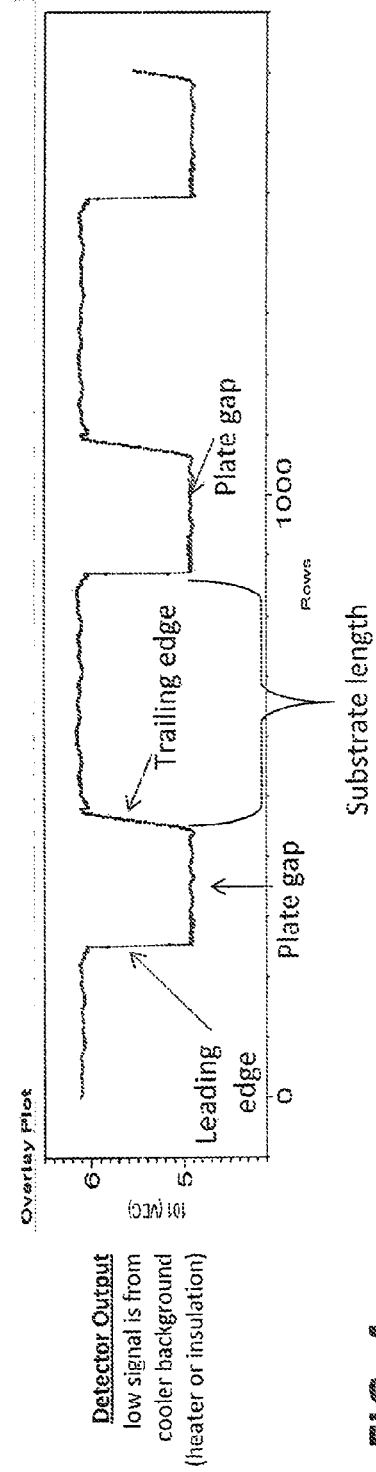
FIG. 4 shows an example detector output from the detector illustrated in FIG. 3.

Referring also to FIG. 4, when gaps between substrates 28 are within the "line of sight" of the infrared detector 30, the detector 30 will output a voltage within a certain voltage range corresponding to the cool background temperature. When the substrate 28 is within the "line of sight" of the infrared detector 30, the detector 30 will output a voltage within a certain higher voltage range (compared to the background detection) corresponding to the higher temperature of the substrate 28. The differences between the two voltage ranges can be used to detect trailing and leading edges of substrates 28.

For example, after the entire substrate passes by the detector 30, there will be a drop in the detector's 30 output voltage due to the detection of the much cooler background temperature. This drop in the output voltage, corresponding to the drop in detected temperature, can be used as a signal that a substrate edge was just detected. In FIG. 4, the rightmost portion of the voltage drop indicates that a trailing edge of a substrate 28 has just completely passed the detector 30 while the leftmost portion of the same drop corresponds to a leading edge of a substrate 28 that has just come into the "line of sight" of the detector 30. The exact position of the edges is determined from the location of the detector 30. A gap length between substrates can also be computed from the same information illustrated in FIG 4. Moreover, as mentioned above, the controller 50 will be able to determine if a substrate has been rotated or skewed from its intended orientation (as discussed above).

Figure 5:
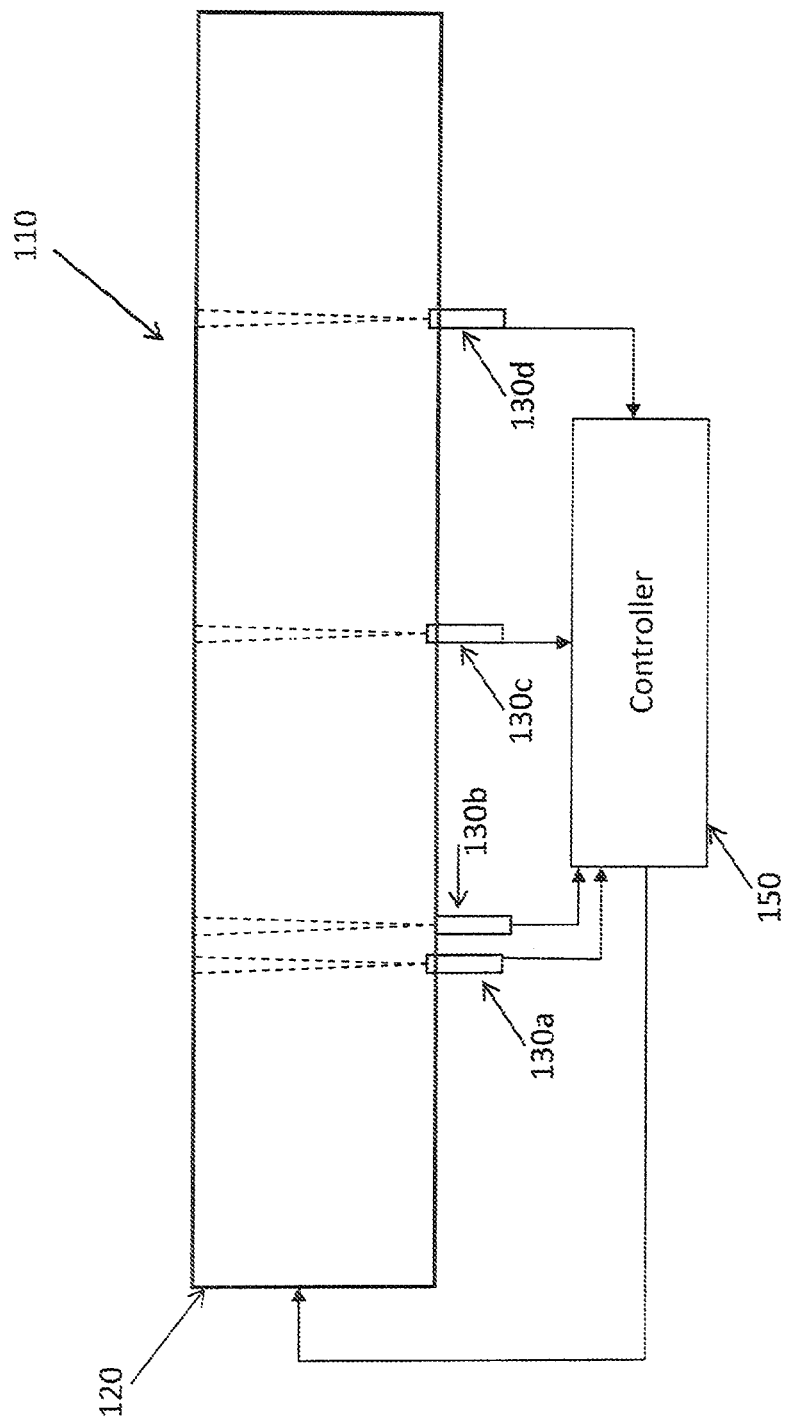
FIG. 5 shows another example system in accordance with an embodiment of the invention.

FIG. 5 illustrates another system 110 constructed in accordance with the disclosed principles. The system 110 comprises a plurality of infrared detectors 130a, 130b, 130c, 130d externally mounted to windows of a processing chamber 120. As with the other detectors 30 (FIGS. 1 and 3), the illustrated detectors 130a, 130b, 130c, 130d will have a "line of sight" into the chamber 120 at points where it is desirable to detect the presence or absence of a substrate or a substrate edge or whether the substrate has been improperly rotated. It should be appreciated that the system 110 could use more or less than three infrared detectors 130a, 130b, 130c, 130d depending upon the application, and that the disclosed principles should not be limited to a particular number of detectors used.

Voltage outputs from the infrared detectors 130a, 130b, 130c, 130d are input into a controller 150. The controller 150 will monitor the input voltages to detect the positions of substrates within the chamber 120 and, if necessary, adjust controls to slow down or speed up portions of the process. One example adjustment would be to control the speed of rollers within the chamber 120 to alter the position of certain substrates 10 keep consistent gaps between the substrates. It should be appreciated that the monitoring and detection of temperature changes will follow the principles discussed above with respect to FIGS. 2 and 4. In the illustrated example, the controller 150 could use the inputs of detectors 130a, 130b, positioned within a know distance from each other, to determine if any substrate has been rotated or skewed.

The disclosed systems 10, 110 will experience improved cycle times in the process e.g., a VTD process, because of accurate substrate detection. It should also be appreciated that using infrared detectors reduces the likelihood of false detections and other failures experienced by conventional substrate detection mechanisms using lasers, light reflectors and light detectors. The disclosed systems 10, 110 are better suited for a deposition or sputtering environment and have many advantages over other detection mechanisms. For example, the systems 10, 110 disclosed herein will not require clean chamber windows because infrared wavelengths pass through typical deposits used within the chamber. Thus, additional maintenance and down time will not be required. Moreover, the alignment issues experienced by detection mechanisms relying on lasers, light reflectors and light detectors will not exist in the systems 10, 110 disclosed herein because a reflector is not required. As can be seen, one major advantage of the disclosed systems 10, 110 is that there is no need to ensure a clean beam path into the chamber because detection is being based on temperature and not reflected light.

Details of one or more embodiments are set forth in the accompanying drawings and description. Other features, objects, and advantages will be apparent from the description, drawings, and claims. Although a number of embodiments of the invention have been described, it will be understood that various modifications can be made without departing from the scope of the invention. Also, it should also be understood that the appended drawings are not necessarily to scale, presenting a somewhat simplified representation of various features and basic principles of the invention. The invention is not intended to be limited by any portion of the disclosure and is defined only by the appended claims.

What is claimed is:

1. A method comprising:
   conveying a substrate in a first linear direction through a substrate processing chamber;
   monitoring a temperature within a portion of a substrate processing chamber using an infrared detector;
   determining when a change in the temperature has occurred by passage of the substrate past the infrared detector; and
   identifying a position of the substrate within the processing chamber by said determined change in temperature.

2. The method of claim 1, wherein the identified position of the substrate corresponds to a trailing edge of the substrate that has passed the detector.

3. The method of claim 1, wherein the identified substrate position corresponds to a leading edge of the substrate that has just approached the detector.

4. The method of claim 1, wherein a temperature of the substrate is cooler than a background temperature of the portion of the processing chamber and said determining step comprises determining when the temperature has risen.

5. The method of claim 1, wherein a temperature of the substrate is greater than a background temperature of the portion of the processing chamber and said determining step comprises determining when the temperature has dropped.

6. The method of claim 1, further comprising:
   determining when a second change in the temperature has occurred by passage of a second substrate past the infrared detector; and
   identifying the position of the second substrate by said determined second change in temperature.

7. The method of claim 6, further comprising determining a gap length between an end of the substrate and a beginning of the second substrate.

8. The method of claim 7, wherein the changed process is a transport speed of the substrate.

9. The method of claim 1, further comprising changing a process within the portion of the processing chamber to change a position of the substrate.

10. The method of claim 1, wherein the processing chamber is a vapor transport deposition chamber.

11. The method of claim 1, further comprising:
    monitoring a temperature within a second portion of the substrate processing chamber using a second infrared detector;
    determining when a change in the temperature has occurred in the second portion of the chamber by passage of the substrate;
    identifying a second position of the substrate by said determined change in temperature in the second portion of the chamber; and
    determining whether the substrate has been rotated using the identified positions.

12. The method of claim 1, wherein the processing chamber comprises a sputter processing chamber.

13. A system comprising:
    a substrate processing chamber;
    a conveyer for transporting a substrate in a first linear direction through the substrate processing chamber; and,
    an infrared detector mounted at a first portion of the processing chamber, said detector having a first output; and
    a controller connected to the first output of the detector, said controller monitoring a temperature within the first portion of the processing chamber using signals received from the first output, determining when a change in the temperature has occurred, and identifying a position of the substrate as it is being linearly transported within the processing chamber and past the infrared detector based on the determined temperature change.

14. The system of claim 13, wherein the infrared detector is externally mounted on the first portion of the processing chamber.

15. The system of claim 13, wherein the identified position of the substrate corresponds to a trailing edge of the substrate that has passed the detector.

16. The system of claim 13, wherein the identified substrate position corresponds to a leading edge of the substrate that has just approached the detector.

17. The system of claim 13, wherein a temperature of the substrate is cooler than a background temperature of the portion of the processing chamber and said controller determines the change in temperature by determining when the temperature has risen.

18. The system of claim 13, wherein a temperature of the substrate is greater than a background temperature of the portion of the processing chamber and said controller determines the change in temperature by determining when the temperature has dropped.

19. The system of claim 13, wherein the controller determines when a second change in the temperature has occurred based on passage of a second substrate conveyed by the conveyer through the processing chamber and identifies the position of the second substrate as it is being transported within the processing chamber past the infrared detector based on the determined second change in temperature.

20. The system of claim 19, wherein the controller determines a gap length between an end of the substrate and a beginning of the second substrate.

21. The system of claim 13, wherein the controller changes a process within the first portion of the processing chamber to change a position of the substrate.

22. The system of claim 21, wherein the changed process is a transport speed of the substrate.

23. The system of claim 13 further comprising a second infrared detector mounted at a second portion of the processing chamber, said second infrared detector having a second output connected to the controller, wherein said controller monitors a temperature within the second portion of the processing chamber using signals received from the second output, determines when a change in the temperature at the second portion has occurred, and identifies a new position of the substrate being transported within the processing chamber based on the determined second change in temperature.

24. The system of claim 23, wherein the new position corresponds to a rotation of the substrate as it passes through the processing chamber.

25. The system of claim 13, wherein the processing chamber is a vapor transport deposition chamber.

26. The system of claim 13, wherein the identified substrate position corresponds to a location where the detector is mounted.

27. The system of claim 13, wherein the processing chamber comprises a sputter processing chamber.

* * * * *